United States Patent [19]
Javan

[11] 3,970,839
[45] July 20, 1976

[54] GENERATING AND USING COHERENT OPTICAL RADIATION
[75] Inventor: Ali Javan, Cambridge, Mass.
[73] Assignee: Massachusetts Institute of Technology, Cambridge, Mass.
[22] Filed: Dec. 20, 1974
[21] Appl. No.: 535,023

Related U.S. Application Data
[60] Division of Ser. No. 389,970, Aug. 20, 1973, abandoned, and a continuation-in-part of Ser. No. 62,380, Aug. 10, 1970, Pat. No. 3,755,678.

[52] U.S. Cl. .............................. 250/199; 250/211 J; 250/552; 331/94.5 R; 356/23; 357/30
[51] Int. Cl.[2] ...................... H01J 39/12; H04B 9/00
[58] Field of Search ............ 250/211 R, 211 J, 212, 250/338; 317/235 N; 324/79 R; 331/83, DIG. 1; 357/17, 18, 30, 31

[56] References Cited
UNITED STATES PATENTS
3,229,106  1/1966  De Lord ........................... 250/211 J
3,462,605  8/1969  Engeler ........................... 250/211 J
3,649,838  3/1972  Phelan, Jr. ....................... 250/211 J OTHER PUBLICATIONS
Hocker et al., Applied Physics Letters, vol. 12; No. 12, June 15, 1968, pp. 401, 402.

Primary Examiner—George H. Libman
Attorney, Agent, or Firm—Arthur A. Smith, Jr.; Martin M. Santa; John N. Williams

[57] ABSTRACT

Optical radiation generation and detection using metal-to-metal diode junctions. Coherent optical radiation is generated by using an antenna connected to a metal-to-metal diode junction with non-linear current-voltage characteristics and by coupling to the junction electromagnetic radiation energy to interact with the junction, causing emission from the antenna at optical frequency absent from the input. Optical diodes are shown in the forms of a mechanically contacted cat whisker system and as single and multiple microscopic solid portions in an integrated solid mass, defining both the antenna and the junction, preferably as a deposit of solid layers upon a substrate, preferably as overlapping printed circuit line structures. Arrays of such junctions provide enhanced effects; useful arrays include Franklin-Marconi geometries, fish-bone antennas and row and column arrays. Such solid diode constructions and arrays thereof are used not only for optical radiation generation but also detection and mixing including use in an image scanner, energy converter and a broad band detector. The diodes as a radiation source are used in combination with an absorbtion cell in spectroscopic analysis, a feedback loop in a stable frequency source, and an optical frequency communicating system.

8 Claims, 37 Drawing Figures

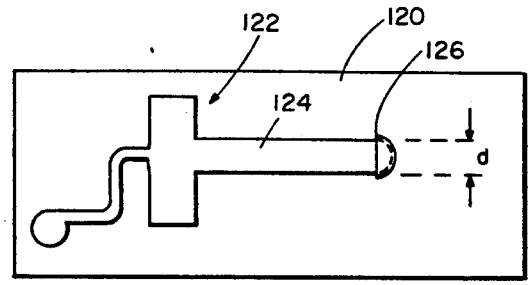
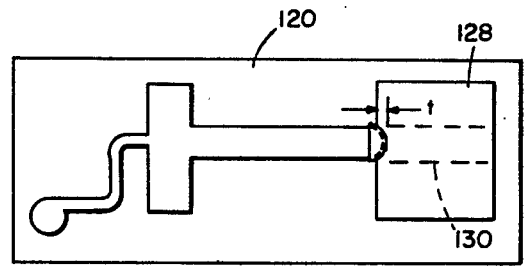
FIG. 6     FIG. 7
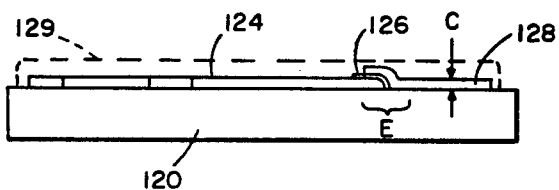
FIG. 8
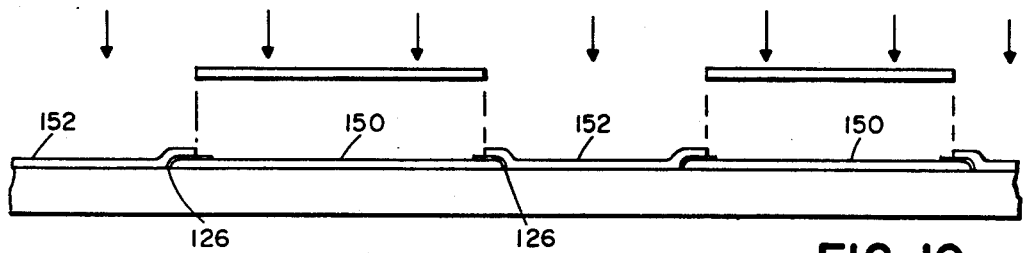
FIG. 10
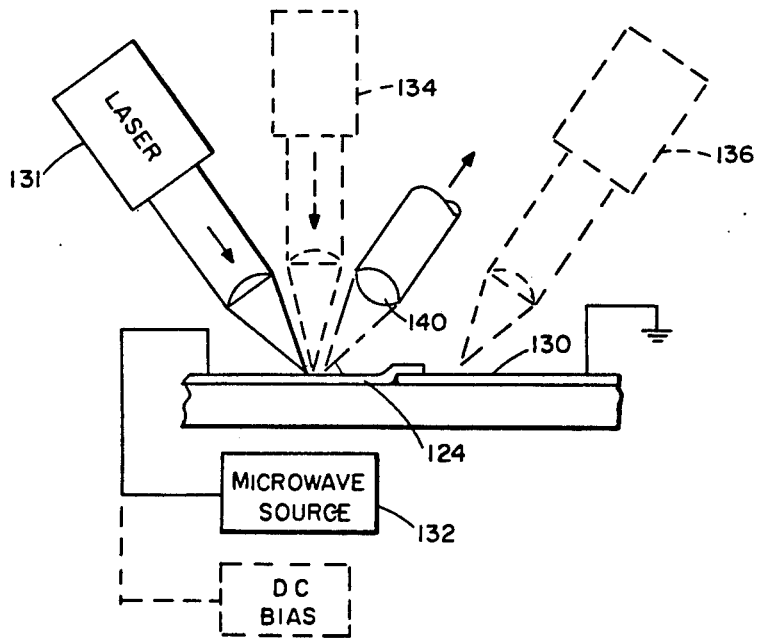
FIG. 9

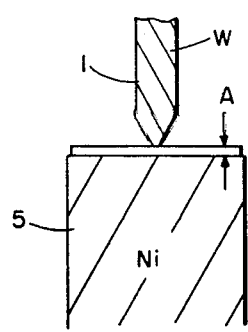
FIG. 16
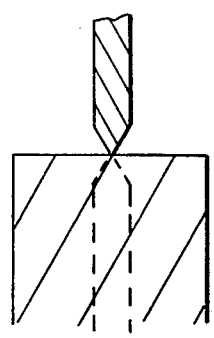
FIG. 16a
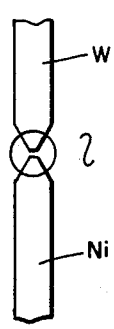
FIG. 16b
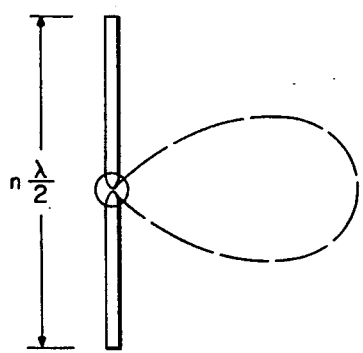
FIG. 17
FIG. 17b
FIG. 17a
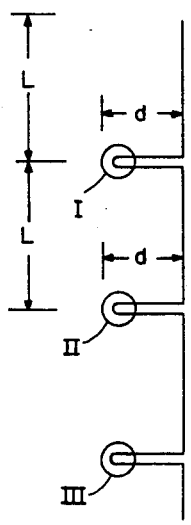
FIG. 18
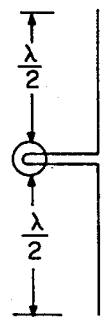
FIG. 18a
FIG. 19

GENERATING AND USING COHERENT OPTICAL RADIATION

CROSS REFERENCE TO RELATED APPLICATION

This is a continuation-in-part of application Ser. No. 62,380 filed Aug. 10, 1970, now U.S. Pat. No. 3,755,678, and a division of application Ser. No. 389,970, filed Aug. 20, 1973, now abandoned.

The Government has rights in this invention pursuant to Contract No. F19628-70-C-0150 awarded by the Electronics Systems Division of the Department of the Air Force, and to Contract No. N00014-67-A-0204-0014 awarded by the Office of Naval Research, Department of the Navy.

BACKGROUND OF THE INVENTION

This invention relates to generating and detecting radiation, especially optical radiation with wavelength lying in the far infrared, infrared, visible, or intermediate regions of the spectrum.

Coherent optical radiation has been generated using lasers and bulk non-linear media. Prior to my work, visible and near infrared radiation had not been detected in direct response to an induced alternating current flowing at the frequency of the applied radiation, other types of detectors have had deficient characteristics, especially when operating without special provision for cooling. However to a certain limited extent work involving a cat whisker as a detector at relatively low frequencies has been previously published, see Hocker and Javan, Frequency Mixing In Infrared and Far Infrared Using Metal to Metal point contact diode; Applied Physics Letters, Vol. 12; No. 12, June 15, 1968 pp 401,402.

The present invention features generating coherent optical radiation by providing an antenna connected to a metal-to-metal diode junction with non-linear characteristics, (as by maintaining the pointed end of a metal cat whisker in contact with a metal base or by use of solid overlapped metal deposits) and coupling to the diode junction electromagnetic energy sufficient to interact with the junction to cause generation of current through the junction, flow of the current in the antenna and emission of radiation from the antenna, the current and radiation being of optical frequency which is related to the frequency of the input and absent from the input.

Preferred embodiments of the invention feature collecting the radiation emitted from the antenna for direction to a station for utilization, using a modulated microwave input to cause the emitted radiation to be correspondingly modulated, mixing such microwave input with an input of optical frequency to produce the optical radiation, applying a d.c. biasing voltage across the junction to shift the operating point on the current-voltage characteristic into a region for optimum performance when the emitted radiation is produced by even order mixing, making the pointed end of the whisker with a radius of curvature less than 50 nm., making the diameter of the whisker smaller than the wavelength of the emitted radiation, making integrated solid diodes, in particular with microscopic overlapping line structures as described below singly and in phased arrays, promoting coupling and using the diode construction in combination with an absorbtion cell and a detector in spectroscopic analysis, using a feedback loop to control the emission of the diode in a frequency source, and using a demodulating diode to extract a signal from an optical beam in a communication system.

The invention achieves a high degree of control of the frequency of emitted optical radiation and particularly frequency stabilization of optical radiation for use, for example, in a frequency standard; controlled sweeping of the frequency of optical radiation for use, for example, in spectroscopic analysis; and modulation of an optical carrier beam over a wide band, including high frequencies, for use, for example, in a communication system.

The invention also features, both for use in generation of radiation, but also with application to detection, an integrated solid construction comprising successive metal deposits having a limited, i.e. microscopic, common area at which the deposits are separated by a thin dielectric layer, preferably sufficiently thin to allow electron tunneling and preferably the diode or a succession of them being achieved by microscopic line structures overlapping at their tips, the line structure serving as antennae for receiving incident optical radiation to produce an electrical effect such as mixing, production of a voltage across the junction, or in the case of generation, producing an alternating electrical current which, in proceeding to the antenna, causes radiation at the new synthesized frequency.

Preferred embodiments according to this aspect of the invention feature a plurality of such antennas and junctions deposited in an array on a substrate; series connection of array antennas and junctions to provide a composite antenna structure with successive connections effective as rectifying junctions alternating with non-responsive connections, the non-responsive connections being made so by use of an ohmic connection, by having an excessive area, by being placed at a node of a standing wave; or cancellation of rectifying voltages in successive junctions is avoided by use of a series d.c. bias; enhancement of radiative coupling by making each of the deposited antennas a length $n \lambda/4$ where $n$ is a chosen integer and $\lambda$ is the wave length of a frequency of interest to enable effective coupling, by making each of the antennas a length onger than the $1/e$ attenuation length characteristic of the antenna relative to the frequency of interest, by making each antenna non-resonant and much shorter in length than the wave length of the radiation of interest, by positioning antenna-forming deposits into a phased array relative to an optical frequency of interest; or by arraying the antennas in a Franklin-Marconi geometry with co-linear antenna sections and re-entrant sections, the colinear sections constructed to relate to optical radiation in phase and the two legs of each re-entrant section constructed to cancel the effects of each other and thereby not relate to radiation out of phase with said in phase radiation; the positioning of diode junctions at the extreme excursion of re-entrant sections, or in the middle of colinear antenna sections.

Embodiments also feature: linear, planar, and 3-dimensional arrays of antenna-junction devices deposited on a substrate and arranged to produce cooperative directional radiation and use of a transparent substrate and a reflective coating at a predetermined depth or of integrated optics to enhance coupling.

The integrated diodes are employed according to the invention as detectors either for specific frequencies or over a range of optical frequencies, e.g. as room-temperature broad band detectors or power converters. A dense array of the devices is featured to resolve an image for scanning purposes.

Further features and advantages of the invention will appear from the following description of preferred embodiments thereof taken in conjunction with the accompanying drawings.

BRIEF DESCRIPTION OF THE DRAWINGS

FIG. 6 is a highly magnified diagrammatic plan view of a solid state device according to the invention at a first stage of manufacture;

FIG. 7 is a similar view of the completed device of FIG. 6; and

FIG. 8 is a diagrammatic side view of the embodiment of FIG. 7;

FIG. 9 is a diagrammatic side view of the device of FIG. 8 in a device for generating coherent radiation;

FIG. 10 is a diagrammatic side view similar to FIG. 8 of an array of series-connected devices similar to the individual device of FIG. 8.

FIG. 16 is a highly magnified diagrammatic cross-sectional view of a mechanically contacted point contact diode structure;

FIG. 16a is a view similar to FIG. 16 illustrating the reflection effect; and

FIG. 16b is a side view of two antennas forming a point contact diode system according to the invention;

FIGS. 17, 17a and 17b illustrate various antenna lobes associated with respective antennas;

FIG. 18 is a highly magnified diagrammatic view of a series array of diode devices forming effectively a Marconi-Franklin antenna; and FIG. 18a is a similar view of another such antenna employing a single diode device;

FIG. 19 gives a symbolic representation of a diode device used in other views herein;

FIG. 29 is a cross-sectional view of an integrated optics device incorporating an array according to the invention while

DESCRIPTION OF THE PREFERRED EMBODIMENTS

Figure 1:
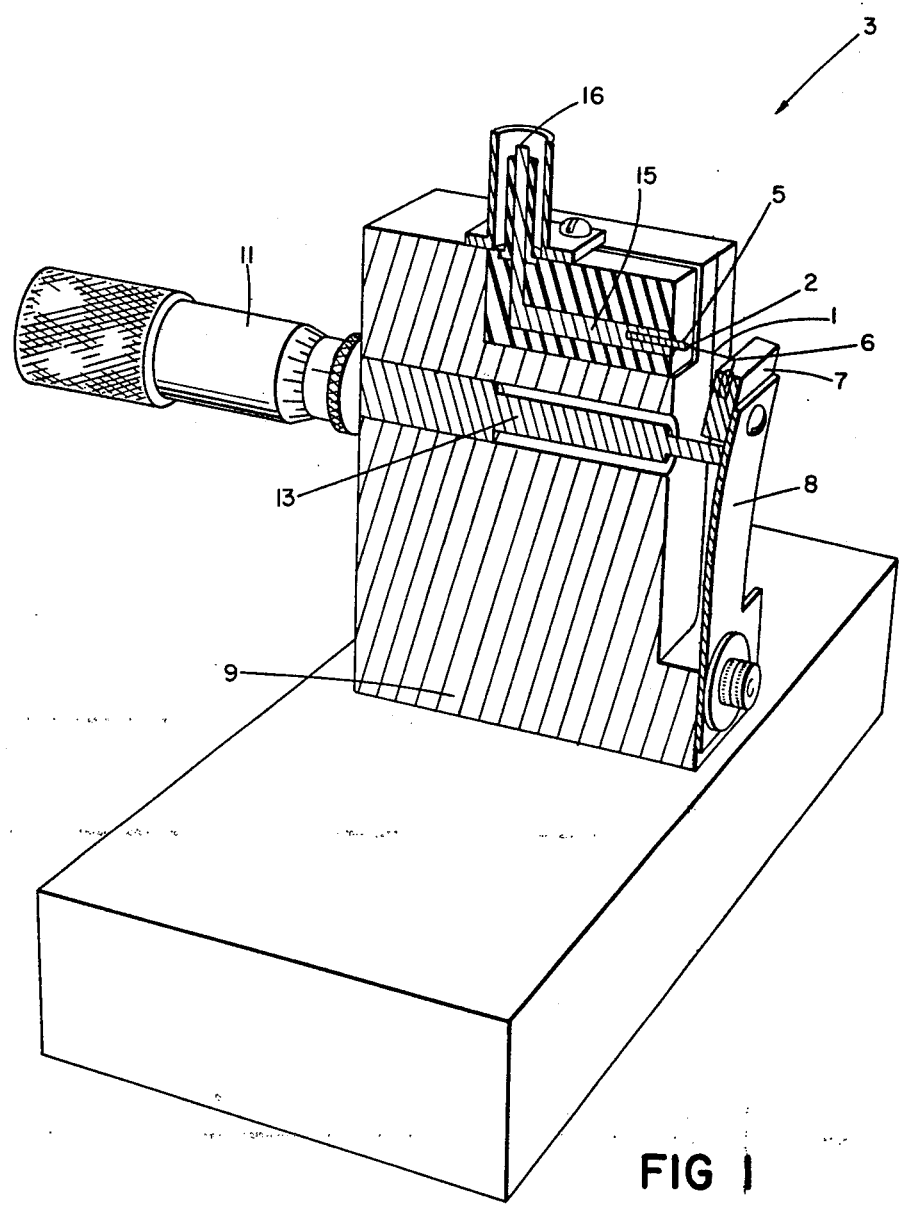
FIG. 1 shows in perspective and partly cut away the construction of a metal-to-metal, point-contact diode according to the invention.

A metal-to-metal point contact diode as used in the invention is illustrated in FIG. 1. The diode is similar in construction to diodes used as mixers for detection of infrared radiation (Hocker et al.: *Applied Physics Letters* 12, No. 12, p. 401 of June 15, 1968) and for microwave detection (Dees: *Microwave Journal*, Sept. 1966, pp. 48–55). Diode 3 includes a thin tungsten wire antenna 1, a "cat whisker", and a nickel base 5. The whisker 1 advantageously has a diameter of the order of the wavelength or less of the electromagnetic radiation to be detected, emitted, or whose frequency is to be measured, and in the preferred embodiment is approximately two microns in diameter, several millimeters in length, and has tip 2 whose point advantageously has a diameter about 100 nm or less (that is a radius of curvature 50 nm or less) and makes contact with nickel base 5 to provide the diode junction. The base 5 is held in place by a brass post 15 which in turn is connected directly to the center contact of a coaxial connector 16.

The whisker is held in place by a "whisker holder" 7 to which it is soldered by standard techniques. In general, the whisker is not wetted, but is held by solder which squeezes it. The whisker holder, in turn, is mounted to a flexible phosphor bronze strip 8 which is attached to the bottom of the main frame 9.

A micrometer 11, whose shaft 13 rests against the bronze strip 8, is attached and fixed with reference to frame 9. By adjusting the micrometer 11, the displacement of the phosphor bronze strip from frame 9 is controlled, whereby the displacement and contact pressure of the cat whisker 1 relative to the metal base 5 is controlled. A ninety degree bend 6 is placed in a cat whisker 1 so that the whisker holder acts as a pivot point thereby providing a fine tuning effect with reference to adjusting the contact pressure between the whisker 1 and metal base 5.

The construction of the whisker is accomplished by starting with a large diameter wire and etching it down to a smaller diameter over as much of the length as is desired. In this process, a KOH solution of about 0.1 normal is used and a six-volt AC source is applied across the wire. The resulting current through the wire etches it to a smaller diameter over the length that is submerged in the KOH solution. The point 2 of the whisker is made by etching just the end of the whisker in the solution, by either etching it away completely or by rapidly etching for a short time. The resulting point has a radius of curvature of 50 nm.

For operation of the diode, micrometer 11 is adjusted such that the tip of the cat whisker 1 just makes contact with the nickel base 5. Electromagnetic input with components of one or more frequencies is coupled to the diode. This may be done by exposing cat whisker 1 near the junction with base 5 to radiation. The cat whisker 1 acts as an antenna coupling the radiation field to the diode. It is advantageous in coupling optical radiation to focus the radiation to a spot of size comparable to the wavelength of the radiation. Microwave frequency input (for example from a klystron tube) may be satisfactorily coupled by connection to coaxial connector 16. The coupled input interacts with the junction to cause a current to flow through the junction. Due to the non-linear characteristic of the junction, which may be the result of electron tunnelling effects in an oxide film on the base, the current is not linearly related to the input but contains harmonics of the input and sum and difference frequencies. The diode thus acts as a frequency mixer generating frequency absent from the input. In general any generated frequency $F_i$ will be one obtained from the expression $F_i = (af_1 + bf_2 cf_3 + \ldots)$-where $f_1, f_2 \ldots$ are input frequencies and $a, b, c, \ldots$ are non-negative integers. It will also be convenient hereafter to define the order n of a generated frequency as $n = a + b + c + \ldots$ It is readily seen that when some of the input frequencies $f_1, f_2$ etc. are microwave frequencies and some are optical frequencies then the generated frequencies $F_i$ can include some microwave and some optical frequencies.

The microwave frequencies generated as described above in the diode may be sensed by apparatus appropriate to processing microwave signals connected to coaxial connector 16. It has been found that optical frequencies generated in the diode are emitted as radiation at detectable levels from wire 1 so that the generated optical frequencies can be collected and directed with conventional optical elements such as lenses and mirrors. Using the diode it is therefore possible to control the frequency of the emitted optical radiation by manipulating the frequency of a microwave input.

Figure 2:
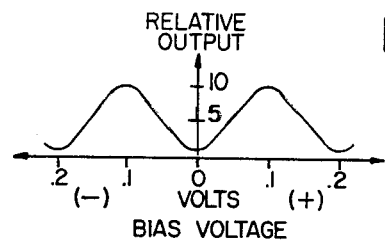
FIG. 2 shows a plot of the output of the diode useful in explaining its operation.

It has also been found that the amplitude of the various generated frequencies is influenced by a d.c. bias voltage applied across the diode junction. For odd order generated frequencies the output is found to be near maximum with zero bias; for even order generated frequencies the output is near minimum for zero bias. FIG. 2 shows the results of mixing lines of the 9.3 $\mu$m band from a $CO_2$ laser with a microwave frequency near 52.6 GHz to generate the first side bands. Since the first side band is an even order, the output is minimum at zero bias in conformity with the statements above. It is readily seen from FIG. 2 that the output of an even order generated frequency may advantageously be enhanced by applying a d.c. bias to the diode.

It is sometimes necessary to try various contact points between the whisker and the base and various pressures to obtain a junction with the required characteristics—namely responsiveness to the highest operating frequency and non-linearity in response. When a good contact is made and with the input frequencies applied, a d.c. voltage is generated across the junction. This serves as a convenient indicator of an effective junction.

A laser input to the diode may be operated in the pulsed mode or continuously. For pulsed operation typically the output from a $CO_2$ laser is 100 watts over one half a microsecond pulse width; from an $H_2O$ laser, 10 watts over 3 microseconds pulse width; and from the microwave source, a klystron, 30 milliwatts. If the lasers and the microwave generator are operated continuously their output should be kept below about 100 milliwatts to prevent diode burnout.

Generating far infrared, infrared and visible radiation is accomplished by subjecting a diode to infrared laser radiation at a frequency. The diode in turn will emit radiation with frequencies that are integral multiples of the laser radiation. Here again, a microwave frequency may also be coupled, and the resulting emitted radiation will have frequencies reflecting the sum and difference and their respective various harmonics.

Figure 3:
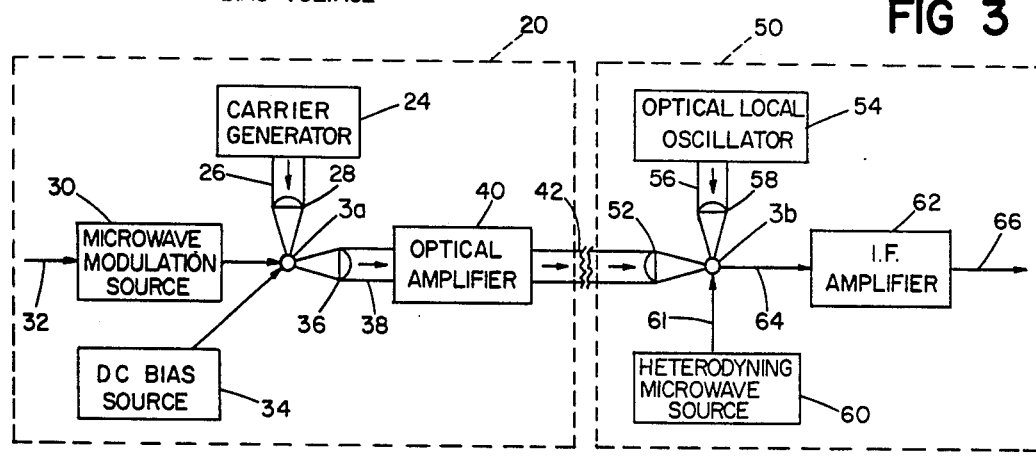
FIG. 3 shows in diagrammatic form a communications system using the diode according to the invention.

Apparatus utilizing two diodes in a communication system can be understood with particular reference to FIG. 3. Sending station 20 includes a diode 3a constructed as described above. Carrier generator 24, which may be a continuously emitting $CO_2$ laser, has its output 26 focussed by lens 28 on the cat whisker of diode 3a near junction 2. Signal input channel 32 is connected to and controls the output frequency of source 30 which may be a tunable klystron. The output of modulation source 30 is connected to coaxial connector 16 of diode 3a. D.C. bias source 34 is also connected to connector 16. Diode 3a, responding to the joint stimulus of the inputs from the carrier source 24 and the microwave modulation source 30, generates and emits radiation at the difference frequency between the sources as described above. The radiation emitted is modulated in accord with the signal. Lens 36 collects optical radiation emitted by diode 3a and collimates it in beam 38, which enters optical amplifier 40. The output beam 42 from amplifier 40 is directed from sending station 20 to receiving station 50.

Receiving station 50 includes diode 3b constructed as described above. Beam 42 is focused by lens 52 on the cat whisker of diode 3b. Optical local oscillator 54, which may advantageously be a continuously emitting fixed frequency $CO_2$ laser, has an output beam 56 which is focused on the cat whisker of diode 3b by lens 58. Microwave heterodyning source 60, which may advantageously be a fixed frequency klystron oscillator, has its output 61 connected to connector 16 of diode 3b. I.F. amplifier 62 has its input 64 also connected to diode connector 16. Diode 3b mixes its inputs as described above to generate a signal-modulated microwave input to amplifier 62. The output of amplifier 62 is connected through signal channel 66 to apparatus where it will be used or further processed.

Figure 4:
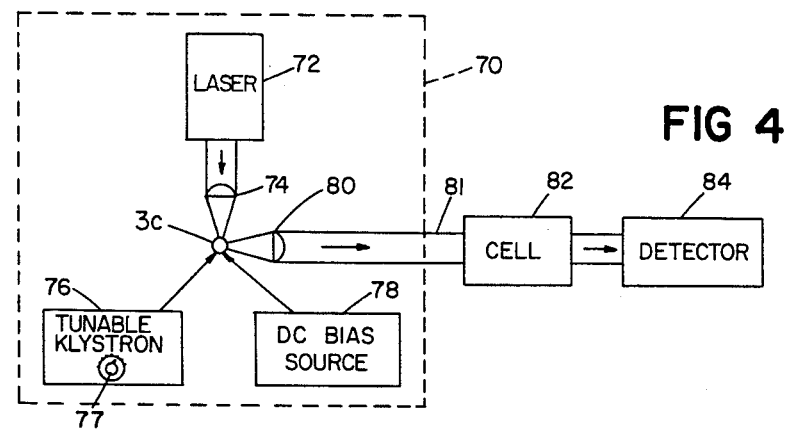
FIG. 4 shows diagrammatically a set-up for spectroscopy using the diode according to the invention.

A use of the diode in spectroscopy according to the invention is shown in FIG. 4. Tunable radiation source 70 includes stable laser 72, the output from which is focused by lens 74 on diode 3c constructed as described above. Tunable klystron 76 tuned by control 77 is connected to connector 16 to couple its output to diode 3c, and d.c. bias source 78 is also connected to connector 16. When stimulated by both laser 72 and klystron 76, diode 3c radiates at a frequency equal to the sum of the input frequencies and also at the difference frequency. The optical radiation from the diode is collected by lens 80 and directed to absorption cell 82 containing a material with an unknown spectrum in absorption. Radiation passing through cell 82 passes to detector 84. By progressively tuning the klystron through a range of frequencies the (say) difference frequency generated by the diode will change through a corresponding range. The absorption of the material in the cell to the various frequencies in the diode output is measured by the detector to ascertain the unknown absorption spectrum of the material.

Figure 5:
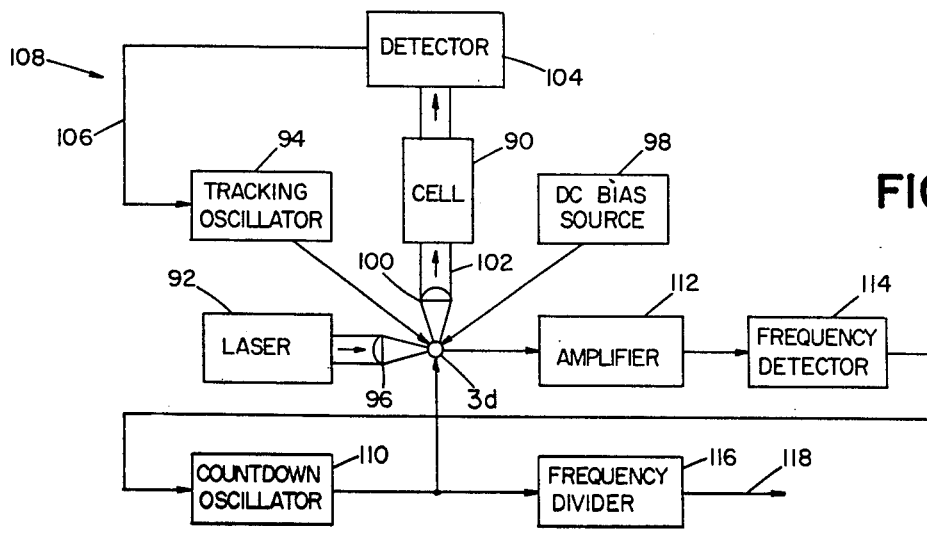
FIG. 5 shows diagrammatically a set-up for providing a stable frequency using the diode according to the invention.

The use of the diode in a frequency standard may be explained with special reference to FIG. 5. Cell 90 contains a frequency standard material with an optical resonant absorption line of known frequency which is sharp enough to provide a frequency base of the accuracy required. Laser source 92 and tunable tracking oscillator 94, which may advantageously be a klystron, are selected so that by tuning oscillator 94 the difference frequency between oscillator 94 and laser 92 can be swept through the absorption line of the material in cell 90. The output of laser 92 is focussed by lens 96 on the cat whisker of diode 3d constructed as described above. The output of microwave oscillator 94 is coupled to diode 3d by connecting to connector 16. D.c. source 98 is also coupled to diode 3d by connecting to connector 16. Acting under the joint stimulus of laser 92 and oscillator 94, diode 3d emits radiation at the difference frequency. This radiation is collected by lens 120 into beam 102 and directed through cell 90 to detector 104. The attenuation of beam 102 in passing through cell 90 will depend on the frequency of the beam with respect to the resonant absorption line of the material in cell 90, the maximum absorption, and consequently the minimum throughput, occuring when the frequency of the beam 102 exactly corresponds to the frequency of the absorption line. Detector 104 operates as a sensor for the correspondence of the frequency emitted by the diode in beam 102 to the frequency of the absorption line which is the frequency base of the system. The output of detector 104 is connected through channel 106 to control the tuning of oscillator 94, thus forming a feed-back loop 108. Using well-known techniques and circuitry, the loop will control the tuning of oscillator 94 so that the frequency of the radiation emitted by diode 3d and passing in beam 102 will be maintained in close correspondence to the absorption line of cell 90. It should be noted that drift in the output of laser 92 is tolerable in the system, since the feedback loop through cell 90 causes the oscillator 94 to track the laser frequency producing a difference frequency more stable than the direct output of the laser and determined essentially by the absorption resonance in cell 90. Countdown oscillator 110 tunable in a range including a subharmonic (say the 14th) of the absorption line of cell 90 has its output coupled to diode 3d by connection to terminal 16. Diode 3d mixes the input from oscillator 110 with the inputs from laser 92 and oscillator 94 to generate a beat at a frequency equal to the laser frequency less the sum of the tracking oscillator frequency and the 14th harmonic of the countdown oscillator. This beat is transmitted to amplifier 112 by way of a connection to connector 16. The output from amplifier 112 passes to frequency detector 114, the output of which is connected to control the tuning of countdown oscillator 110 in a feedback loop so that oscillator 110 operates in a fixed frequency relationship with the difference frequency between the laser and the tracking oscillator. The output of countdown oscillator 110 is also connected to conventional divider circuits 116 which provide on output channel 118 a convenient frequency for further use. It may readily be seen that through the feedback loops connected through diode 3d, the output on channel 118 is locked in a fixed ratio to the frequency of the absorption line of cell 90 and so will exhibit the same degree of stability.

According to a further aspect of the invention a solid integrated structure capable of generating wave lengths down to 10 microns or shorter (or detecting same) is realizable providing the necessary non-linear junction in the form of a dielectric layer or layers interposed between fixed conductors. Such non-linear junctions realize advantages of vibration-resistant stability, compact packing and ruggedness, permitting use in the field. (These junctions are for convenience referred to herein as "diodes" although use of more than two conductor layers and several dielectric layers to form a junction configuration such as triodes, etc., are to be understood included.)

In the presently preferred form this solid diode comprises a deposit of solid layers upon a substrate, manufactured in accordance with generally known microelectronic methods, and preferably presented together with other such diodes in a predetermined array, such as one of the preferred arrays described below. For constructing diodes operable in the 10 micron range, the techniques of photolithography, e.g. as described in Smith, Bachner and Efremow, *Journal of Electrochemical Society: Electrochemical Technology*, May 1971, Vol. 118, No. 5 are applicable, in which deposited lines to an accuracy of less than 1 micron are realizable. Alternatively, and of particular utility for shorter wave lengths, one may employ the methods of electron beam microfabrication such as are described in "Microcircuits by Electron Beam", Broers and Hatzaki, *Scientific American*, November, 1972.

Referring to FIG. 6 the first step in forming a single diode according to this aspect of the invention is to deposit upon a substrate 120 (preferably transparent to the radiation of interest, e.g. silicon or aluminum oxide for infrared radiation) a conductive line structure 122 including antenna leg 124 of tungsten (or in other instances copper, nickel or other appropriate conductive material). The antenna leg 124 has a width d of the order of 1 micron. According to the next step, the metal of this line structure or at least the tip of leg 124 for the point contact region is allowed to oxidize, forming what will become a potential barrier consisting of a dielectric layer 126 of a few angstrom (of the order of 1 nm) thickness. Then, referring to FIGS. 7 and 8 in a third step a thin metal layer 128, in this embodiment nickel, is deposited on the substrate beyond line structure 122, with a controlled thickness c less than 1 micron and slightly overlapping the top of leg 124 in region E, a distance t kept small, less than 1 micron. The smallness of overlap t and the narrowness d of the tip of leg 124 cooperate to keep the overlap area, hence the capacitance of the contact, very low, e.g. the RC time constant of the resultant structure permitting response to radiation of wave length on the order of 10 microns, or exhibiting an RC time constant as short as $10^{-15}$ sec. (For use at larger wave lengths, e.g. for the far infrared region or where many diodes are employed in array, tolerances are progressively not as critical. It is also possible, in case of the RC time constant being longer than the period of an optical cycle, to operate in the "roll off" region. In this case a useful response can still be obtained even through the speed of the junction is somewhat slower than the frequency of the radiation. For instance for a junction area on the order of $1\mu$ diameter and a series resistance arising from an antenna with an impedance of about 50 ohm, depending upon the thickness of the dielectric layer of say 8 A the speed of response can be about $10^{12}$ Hz. Such a junction however still will respond to radiation of $10\mu$ wave length. In this case however the device will operate at a roll off point which is down by a factor of 30 from response at $10^{12}$ Hz, which corresponds to 300 $\mu$ wave length.) Thereafter, a protective layer of dielectric transparent to the wave length of interest may be applied over the entire structure, as suggested in the dashed lines 129 of FIG. 8.

For the purpose of producing a second antenna for the diode, layer 128 may be made narrow as suggested by dashed lines 130 in FIG. 7, e.g. with a width d, or somewhat wider for ease of fabrication in aligning the first and second deposits for overlap.

As an alternative to the oxidizing step just mentioned, a controlled layer of dielectric material of selected barrier potential for the particular conditions of interest can be deposited. In such case, after the first step of depositing the antenna 124, this structure or its tip is cleaned of any oxide layer (e.g. by ion bombardment or electron beam cleaning in vacuum). Then a low vapor pressure of the selected dielectric can be introduced to provide a thin layer of controlled thickness of a few angstroms over the tip or the whole conductor and substrate. Afterward, while still operating in vacuum, the third step of depositing layer 128 can be accomplished.

Utilization of the solid structure just described is the same as described above for the mechanically contacted point contact system. Referring to FIG. 9 laser 131 of a selected frequency directs its radiation upon antenna 124 establishing currents of corresponding frequency in the antenna and in the contact region. One or more currents of other frequencies as from microwave source 132 or as induced by other lasers 134 (or 136 in the case of the second conductor 130 being properly sized) are mixed in the contact region with the current established by laser 131, producing current components of frequencies at the sums and differences of the frequencies of the inputs and harmonics. These new components travel to the antenna and are radiated therefrom, being collected by lens 140 and transmitted for utilization. As mentioned in regard to other embodiments described above, DC bias may be applied to enhance the output under various circumstances.

Figure 11:
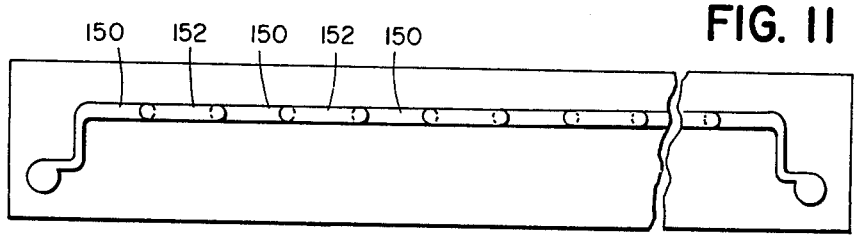
FIG. 11 is a diagrammatic plan view thereof.

Referring to FIGS. 10 and 11, a series array of solid diodes as just mentioned is comprised of first and second metal antenna line-structure deposits 150 and 152 of different metals such as tungsten and nickel, deposited by the techniques mentioned above with a dielectric layer interposed in the contact regions of interest. Layers 150 are first deposited in spaced-apart relation and then, after provision of the dielectric layer, layers 152 are deposited each between and overlapping the ends of a pair of layers 150. To enable effective coupling the length of each line segment is an odd integer multiple of $\lambda/4$ where $\lambda$ is the wave length of the highest frequency of interest or longer than the $1/e$ attenuation length characteristic of the antenna or is non resonant and much less in length than the wave length. This construction allows coupling of the incident rays simultaneously with several diodes and as well permits radiation to be generated simultaneously by several diodes.

In certain instances where radiation from the diodes is concerned (as well as in the detection or utilization of electric signals induced in the antenna by incident radiation) special arrangements are provided to prevent cancellation of radiation in a given direction (or of rectified voltages) from various diodes in the series.

Figure 12:
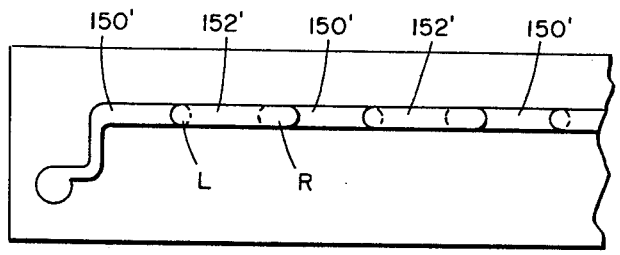
FIG. 12 is a plan view similar to FIG. 11.

Referring to FIG. 12 lines 150' of tungsten and subsequent lines 152' of nickel are deposited as above however the amount of overlap of each line structure 152' is different at its two ends. At the left end L the extent of overlap is very limited, in accordance with the preceding embodiments to less than 1 micron to provide an R C time constant that enables response at the highest frequency of interest. However at the right end R of each line 150' the extent of overlap is grossly larger, e.g. several microns, and non-responsive. Response to the frequencies of interest and mixing them occurs at the ends L but not at ends R, hence no cancellation results. (If the two successive overlaps were of the same length, due to the reversal of the dissimilar metals, opposite rectification of voltages would occur at the two ends with resultant cancellation.)

Figure 13:
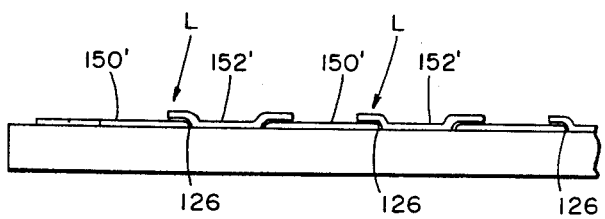
FIG. 13 a side view similar to FIG. 8 of a series-connected array with differing connections between antennas for avoiding cancellation effects.

In the alternative embodiment of FIG. 13, the overlap of the second deposits 152 at the two ends are identical in extent. However by means of masking or otherwise during application of the dielectric, the dielectric layers 126 are provided only at the left ends L of lines 152. Thus only at those ends are the effective diodes created, the contact between the right ends of lines 152 and the adjoining lines 150 being ohmic and not capable of producing any rectified voltage or mixing.

Figure 14:
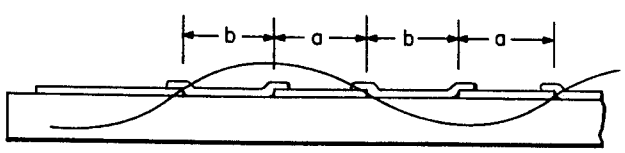
FIG. 14 is a similar side view of a device which is constructed to operate with a standing wave to reduce cancellation effects.

In the alternative embodiment of FIG. 14 the series line structure is made as in FIG. 10, with identical diode constructions at each end of each line 152, however the overall length of the series array is made less than $1e$ characteristic attenuation length of the antenna for the wave length of interest, so that a standing wave can be established, with the effective parameters selected so that a current maximum occurs at a first diode, a node at the next and so on, as indicated in FIG. 14. Maximum rectification will occur at the points of maximum energy, little in the reverse direction at the nodal points. Here the sum of the lengths a of each line 150 and b of each line 152 should bear a special relation to the wavelength of interest $\lambda$, i.e. $(a+b) = n\lambda/2$ with $n$ as an integer. In the example of FIG. 14 $n = 1$ but $n$ can be larger than unity.

Figure 15:
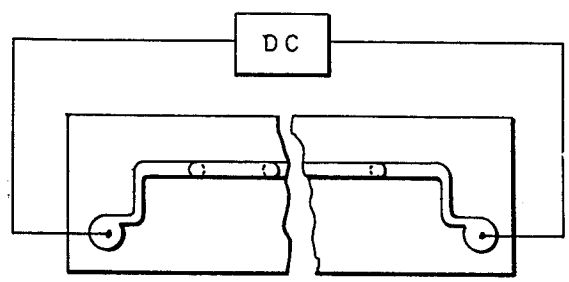
FIG. 15 is a plan view similar to the device of FIG. 11 employing D.C. bias.

In the alternative embodiment of FIG. 15 the series of diodes is constructed as in FIG. 12 except that the metals of line structure 150 and 152 may be similar (have similar work functions) and DC bias is applied between the terminals, thus biasing the entire series in the same direction. The rectification at successive diode junctions will then be of the same sign, hence will not cancel.

With regard to the solid diodes here described, the dielectric substance for layers 126 is chosen to have a nondiffusing characteristic with respect to the metals which it contacts under operating conditions. Tungsten oxide meets this requirement even in operating conditions at room temperature. In other instances working conditions are chosen at cryogenic temperatures, e.g. at temperature of liquid helium in order to avoid disruptive diffusion. By selectively depositing the dielectric layer, as by deposit in vacuum, the barrier potential of the layer material may be controlled by selection of the material, its geometry (especially size) controlled by masking and its thickness controlled by vapor density and duration, all to optimize the particular response being sought.

Going beyond the fabrication of the diodes as printed circuits as just described, the various highly accurate microelectronic techniques are also used, according to the invention to realize printed matched diodes and arrays thereof for parametric generation and detection of electromagnetic radiation in the farinfrared, infrared and visible regions.

To explain the operation of these arrays, certain considerations concerning the coupling between the electromagnetic radiation and the point contact diode will first be mentioned. Taking first a single mechanically contacted diode as illustrated in FIG. 1, in magnified scale, shown in FIG. 16, the tungsten wire antenna 1 whose tip is pointed is mechanically contacted with another metal part 5. The tip of the tungsten antenna, which is on the order of several hundred Angstroms in diameter, is separated from the metalic nickel part 5 by a thin oxide layer on the nickel part 5 as well as by the oxide layer on the tungsten tip, combined thickness being several Angstroms. In this system the metal part 5 can be envisaged as a mirror which produces an electromagnetic image of the tungsten antenna as shown in FIG. 16b. Thus the nickel part 5 is equivalent to a thin antenna facing antenna 1, the pointed tips of which are separated by the oxide layers.

In use as a parametric generator of radiation for example, infrared radiation of 10.6 $\mu$ is directed from a $CO_2$ laser to the diode together with the output of a microwave klystron. As has been indicated above, this results in current flowing through the diode's point contact at the infrared frequency, $V_{IR}$ and at the microwave frequency, $V_m$. And due to the diode's nonlinear I–V characteristics, additional current components are generated in the point contact at the synthesized frequencies of the two applied fields. Those current components include currents at frequencies $V_s = V_{IR} \pm n V_m$ where $n$ is an integer. Subsequently, each current component generated at the point contact excites a propagating current wave along the wire antenna (and its image), which subsequently radiates at the corresponding frequency. By providing a barrier thickness not exceeding about 8A (Angstrom) the current flow through the oxide layer occurs predominately via quantum mechanical electron tunneling, which in turn gives rise to the non-linear I–V characteristic).

According to the above, the diode of FIG. 1 can be represented as in FIG. 16b. The tungsten - nickel system acts as a long antenna excited at its center, showing the close relationship now conceived between the mechanically contacted diode and the printed diode, in the latter the point or limited area contact being achieved by the slight overlap of the two printed metalic antennas, see FIGS. 7 and 8.

According to the present invention it is realized that the well-known principles of coupling radio-frequency radiation to free space are applicable, with appropriate miniaturized dimensions, to the antenna of these infrared and visible radiation generating and detecting devices here described, it being possible by available microelectronic techniques to manufacture a diode whose antenna is optimally matched to free space according to those principles, or to construct a phased array thereof, to achieve entirely new optical effects. Following well-known principles the antennas can consist of sections, each section consisting itself of several antennas placed in parallel or in series, either with several of them connected to a single diode junction or with each having a separate junction. For convenience the antennas described below are illustrated as single dipole antennas each having a junction. First the diodes as radiaion generators will be discussed.

Referring to FIGS. 17–17c, good coupling with free space is obtained by employing for an infrared radiation of wave length $\lambda$, a straight antenna of length $n \lambda/2$ where $n$ is an integer smaller than about 10, so that the antenna is no more than a few wave lengths long. FIGS. 17, 17a and 17b illustrate the antenna lobes produced when the selected value of $n$ is 1, 2 and 3 respectively; in the case of 10.6 $\mu$ radiation the overall length of the antennas are 5 $\mu$, 10 $\mu$ and 15 $\mu$. As n increases the principal lobes of the infrared radiation turn toward the axis of elongation and therefore involve more ohmic loss and poorer coupling; the radiation impedance also increases, though not as drastically, as n increases over this region, increasing gradually from about 75 $\Omega$ for antenna length of $\lambda/2$ until it reaches a stable value of about 130$\Omega$.

Referring to FIG. 18, the radiating current along the antennas of a linear array of diodes is kept in phase by employing a Franklin-Marconi antenna construction. The combined structure being several wave lengths in length, but for a given length of $L = \lambda/2$ of antenna along its axis, the antenna turns 90° for $d = \lambda/4$, then back upon itself for $\lambda/4$; it then continuing along the axis for $\lambda/2$ and so on as above. Here the current is in phase in each adjacent $\lambda/2$ length, and radiates accordingly (and the current in the $\lambda/4$ sectors will not radiate, the alternate phase thus being suppressed). In this case, as the antenna length is increased, the radiation impedance increase rapidly and the antenna pattern becomes more and more directional. For a single re-entrant section, FIG. 18a (antenna length 2 $\lambda/2$ ) the radiation impedance is about 250 $\Omega$, for 5 $\lambda/2$ it has increased nearly linearly to about 650$\Omega$ and upwards with increase in antenna length. These types of considerations have been well known in the past in connection with radio frequency transmitters or receivers, see *Electromagnetic Theory* by Julius Adams Stratton, pp. 438–460, 1st Ed., McGraw Hill, N.Y. 1941.

In FIG. 18 a deposited point contact region is denoted by each of the circles I, II and III at the extremity of each of the re-entrant sections; alternatively point contacts I and III could be omitted and only point contact II could provide the radiating current.

As a further embodiment of the invention, in the Marconi-Franklin infrared antenna of FIG. 18, the sections are made longer while keeping L and odd number of $\lambda/2$ long and $d$ an odd number of $\lambda/4$, thus for example $L = 3\lambda/2$ and $d = 5$ $\lambda/4$. A certain Marconi-Franklin effect will still be obtained as long as the phase distribution of each of the sections of length L is the same for all of them. Such construction may be employed with very short wave lengths, as being easier to fabricate by virtue of the longer segments.

The solid diode arrays formed by microelectronic techniques are also advantageously provided in two and even 3-dimensional arrays, with further benefit of improved coupling. Preferred embodiments of these are shown in the drawings using the symbol of FIG. 19 to denote a single printed diode, with the tunneling region denoted by the circle.

Figure 20:
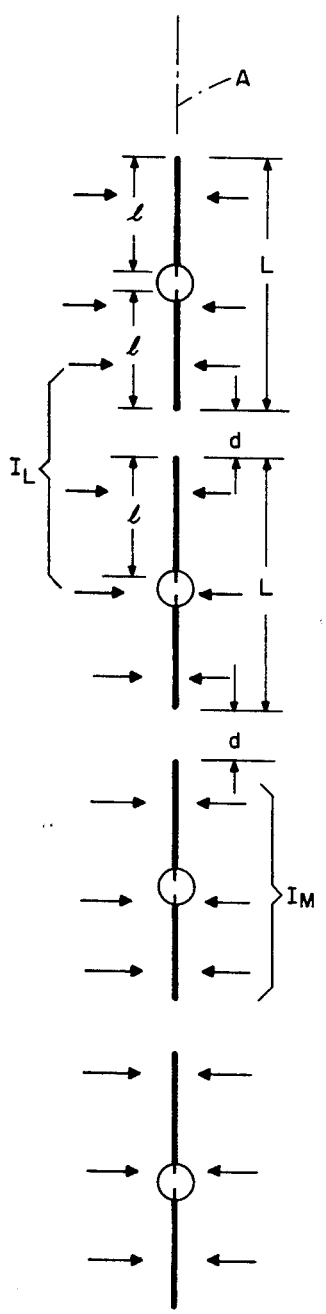
FIG. 20 is a highly magnified diagrammatic plan view of a column phased array of devices according to the invention.

Referring to FIG. 20 there is shown a diode array for parametric generation of a synthesized frequency of two applied fields in the case where D.C. bias is not employed. The array is deposited on a transparent or semi transparent substrate, each diode consisting of two narrow metal antennas of length $l$, overlapped as shown in FIGS. 7 and 8. Overall diode length $L = m \lambda/2$ where $\lambda$ is the wave length of the synthesized frequency to be radiated and $m$ is odd, preferably $l = \lambda/4$ (at $\lambda = 10\mu, l = 2.5\mu$) though depending on the microelectronic method utilized, it may be convenient to manipulate a longer antenna length such as $2l = 3\lambda/2$ (instead of $\lambda/2$) in which case, for $\lambda = 10\mu$, $l = 7.5\mu$ and $L = 15\mu$. The spacing d can be less than $\lambda/2$. All of the antennas are excited by coupling light $I_L$ from an infrared laser source, not shown, in the same direction for all diodes, e.g. perpendicular to the axis A of the array, employing uniform radiation so that all diodes in the array lie in the same phase front (simply assured by making sure that the straight array lies in the wave front of the incident wave). The array is also subjected to second radiation $I_m$ from a source not shown, e.g. a laser or a microwave klystron under similar conditions. Accordingly the phase of the current at the side band frequency $V_s = V_1 + V_m$ will be the same in all of the individual diodes. From this it follows that in the antenna array all of the antennae will be excited in phase at the side band frequency $V_s$ and hence they all radiate in phase at that frequency. The resultant pattern, for $L = \lambda/2$ will be:

$$I(\theta) = A \left[ \frac{\cos(\pi/2 \cos \theta)}{\sin(\pi/2 \cos \theta)} \right]^2 \left[ \frac{\sin(n\pi/2 \cos \theta)}{\sin(\pi/2 \cos \theta)} \right]^2$$

where the polar axis from which $\theta$ is measured is axis A of FIG. 20, along the antenna axis and $n$ is the number of diodes in the array. For large n the array is highly directional, radiating in a plane perpendicular to the array (i.e. $\theta = \pi/2$), the intensity in this plane being proportional to $n^2$ due to reinforcement in this direction.

As suggested above, at very short wavelengths where printing of a diode having a total length $L = \lambda/2$ is inconvenient, a larger length e.g. $L = 3\lambda/2$ or $5\lambda/2$ is chosen. For $L = 3\lambda/2$ and of $<<\lambda$, the pattern of radiation will be:

$I(\theta) = A F_0^2 F_3^2$ $$F_0 = \frac{\sin[(3\pi/2)(\cos \theta + 1)]}{\sin \theta}$$

$$F_3 = \frac{\sin(6\pi n \cos \theta)}{\sin(6\pi \cos \theta)}$$

This array will have directionality as in the previous case except there will be some side band lobes. Also, for $\theta = \pi/2$ the intensity will have the relationship $I \alpha n^2$.

The array of FIG. 20, just described, is useful for generation of even or odd order sidebands in the case of forming the two antenna sections of each diode of dissimilar metals (i.e. different work functions). It is also useful for generation of odd order side band in the case of similar metals (e.g. Ni and Ni, separated by Ni $O_2$). To generate even order side bands ($Vs = V_1 + nVM$ with $n = 1, 3, 5$, etc.) in similar metals requires d.c. biasing as mentioned above.

Figure 21:
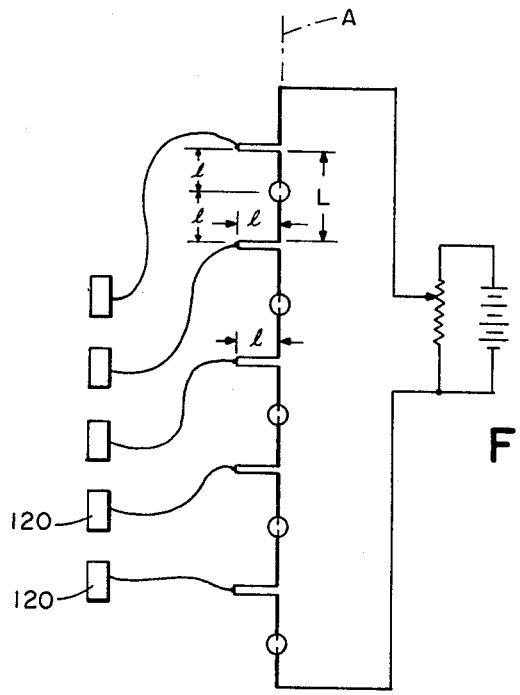
FIG. 21 is a view similar to FIG. 20 of a Marconi-Franklin array.

FIG. 21 illustrates a diode array for parametric generation of a synthesized frequency employing D.C. bias, useful for even order side band generation where the pair of antenna sections of a diode are of similar metals and as well where of dissimilar metals, for improving the frequency mixing, taking the example of the first side band frequency $V_s = V_1 + V_m$.

A Franklin-Marconi array similar to that of FIG. 18 is employed, except that the diode junctions are provided along the axis A of the array, not at the extremes of the re-entrant portions. Preferably $L = \lambda/2$ and $l = L2$, where $\lambda$ is the wave length to be generated, and a re-entrant section of matching length is introduced between each axial length L to maintain in-phase excitation of each half wave antenna section. (Take e.g. $l = 5/4\lambda$ or $9/4\lambda$ if $\lambda/4$ is inconveniently short.)

Pads 120 are connected across each diode separately for testing D.C. continuity of each diode and if a diode is open, enabling it to be by-passed by shunting between the appropriate pads.

Figure 22:
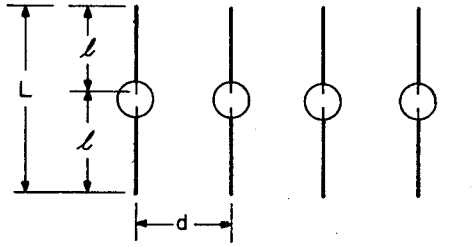
FIG. 22 is a view similar to 22 of a row phased array of devices according to the invention.

In FIG. 22 a parallel diode array is shown which if all excited in phase, as previously described peaks the intensity of radiation in a direction perpendicular to the array. Typically $L = \lambda/2$ (or as before $3 \lambda/2$ etc.) and $d < \lambda/2$.

Figure 23:
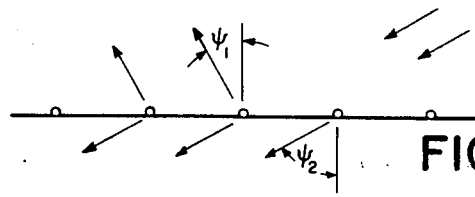
FIG. 23 is a diagrammatic side view of the array of FIG. 22.

If however, referring to FIG. 23, the array is excited so that phases change progressively from one antenna to the next (as by bringing in the exciting laser wave $V_i$ at an acute angle with respect to the normal of the plane of the array) then the radiation generated by the array will be peaked in a direction at a given angle $\psi_1$. If the diodes are excited all in phase at the second frequency $v_m$, then the angle $\psi$ of the radiation at the side band frequency will be close to the angle of reflection of the incident laser. The angle $\psi_1$, may differ from $\psi_2$ due to differences in the refractive index of the two media For separation distance $d > \lambda/2$ the antenna system of FIG. 22 acts as a grating. In this case, in addition to radiation lobes in the direction $\psi_1$, there will be additional lobes corresponding to different orders of a grating with groove separation $d > \lambda/2$.

Figure 24:
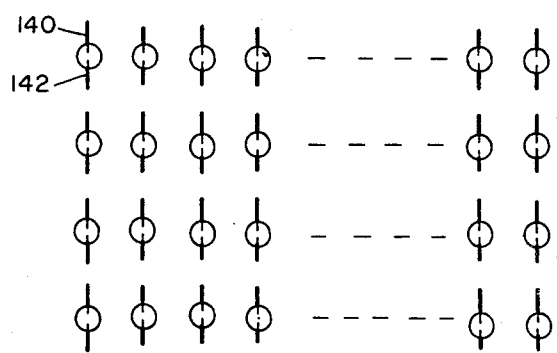
FIG. 24 is a view similar to FIG. 20 of a row column matrix array.

Referring to FIG. 24 a two dimensional parametric generator array is provided combining the two types of linear arrays described in connection with FIGS. 20 and 22. Example: employing similar metal for the two antenna sections 140, 142 of each diode, radiation $V_s = V_L + 2V_m$ is generated by exciting the entire array in-phase at a microwave frequency and, in-phase at the incident laser frequency $V_L$. The resultant radiation $V_s$ will be peaked in the direction perpendicular to the plane of the array (refer to as zero order direction), and if $d > \lambda/2$ there will be additional directions as in the case of grating. The radiation intensity in the reinforced direction will be proportional to $N^2$ where $n$ is the number of individual diodes.

If the laser field is incident at an angle as in FIG. 23, the zero-order radiation at the side band frequency will occur at an angle close to the reflection angle.

Figure 25:
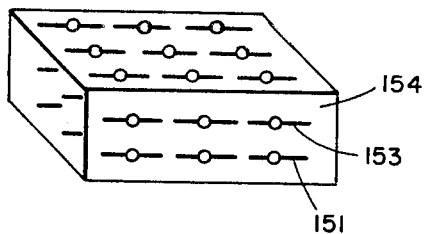
FIG. 25 is a highly magnified and diagrammatic perspective view of a three dimensional array.

Referring to FIG. 25 a three dimensional array is constructed by first printing a two dimensional array 151 as described above, then depositing a layer 153 of transparent dielectric, then printing another two dimensional array 154, and repeating these steps a number of times. Such an array has a radiation pattern similar to the X-ray diffraction pattern of a crystal lattice.

In the various embodiments shown it has been seen that use of phased arrays enables an array gain to be achieved increasing the power of radiation generated in relation to the square of the number of diodes present, as well as by making the radiation directional in various ways as desired.

As has been noted, the printed diodes are also effective to generate currents or voltages in response to incident radiation which can be used for other purposes, as for detecting the presence of incident radiant energy or rectifying or converting such energy to electrical power. In such applications the basic considerations for designing the arrays for detecting or converting are the same as those for generating radiation.

Figure 25A:
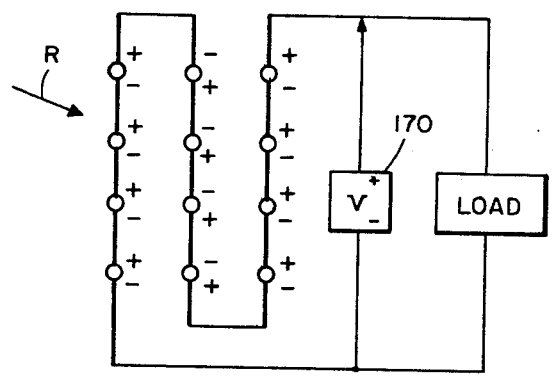
FIG. 25a is a view of an array incorporated in an energy conversion circuit.

Referring to FIG. 25a a power converter is shown in which a series of diodes is exposed to incident radiation which may be infrared or visible radiation, as from the sun. In this case the antenna dimensions may not be matched to a particular wave length, rather the broad band capabilities of arrays are employed to permit conversion of radiation of various frequencies to electricity. This power converter comprises a 3 series array of diodes, the arrays all connected in series. A D.C. bias device 170 applies D.C. bias across each of the diodes in the series, useful to enhance the rectifying property of the junctions (rectification being an even order process). In the case where the junctions are made with similar metal, the D.C. bias introduces a polarity which enables all of the rectified voltages to add up together.

In the case of using dissimilar metals, the rectification and power conversion can be obtained without need for biasing the diodes. However, as noted in reference to FIG. 12 above, the polarity of the contact is such that current flows from the metal of low work-function to that of high work-function. Cancellation of polarities are avoided by the various means described above, rendering every other contact a non-rectifying contact as by making it an ohmic contact or making its contact area large so as not to respond to the high frequency currents here involved.

The load pictured in FIG. 25a may be replaced in an appropriate design by metering or recording apparatus, the unit then being operable as a detector for radiation. When constructed for instance of the preferred nickel and tungsten, it is operable as a broad band detector of high sensitivity when at room temperature, even greater sensitivity being achievable by cooling.

Figure 26:
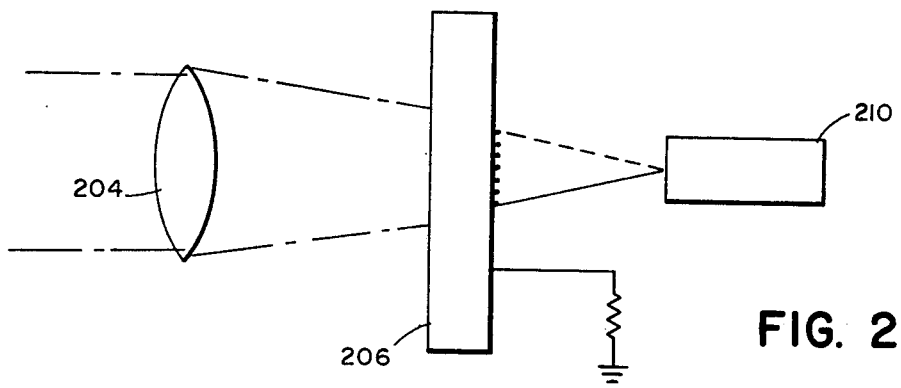
FIG. 26 is a schematic view of an imaging or similar device incorporating the diode system of the invention.
Figure 27:
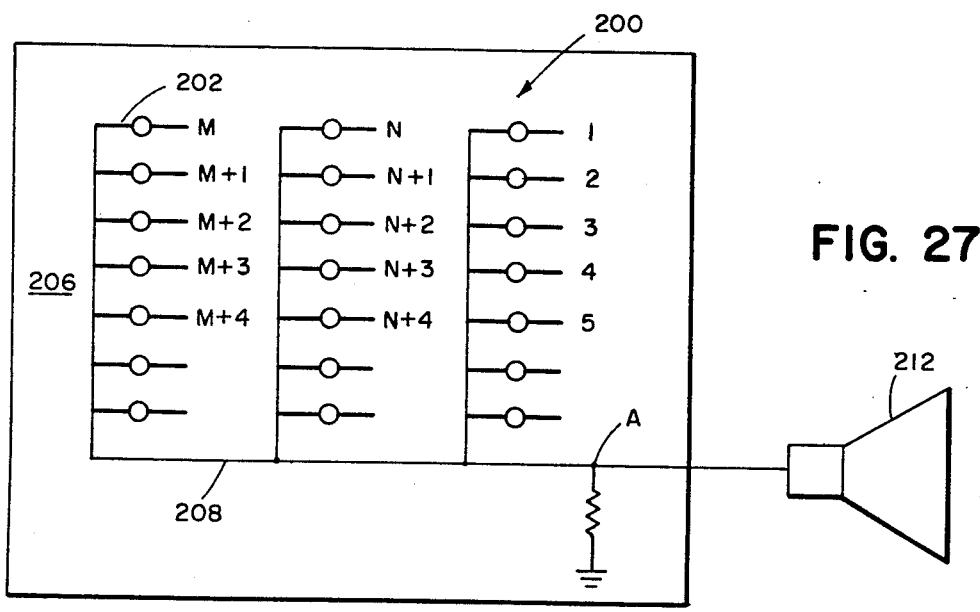
FIG. 27 is a highly magnified, diagrammatic plan view of the array of devices employed in FIG. 26.

Referring to FIGS. 26 and 27 an imaging system is shown in which the light pick up device for the image comprises an array 200 of the printed diodes 202, the diodes sized for response to the wave length of an image projected through lens 204 upon a transparent plate 206. The array is shown disposed on the back side of the plate, with a diode distribution density corresponding to the resolution desired, the antenna of each diode being exposed to light rays of a corresponding picture element of the image, the rays reaching the diode through the transparent substance of the plate 206. For instance if the rays forming the image are of a wave length of 10 $\mu$, the substance of plate 206 may be silicon, which is transparent to that radiation.

Depending upon the amount of radiation present at a given picture element at a given instant, the diode corresponding to that element will produce a rectified voltage across the diodes. All of the diodes are connected through conductor 208 to common point A. By a raster scan of electron gun 210, the array is scanned and the instantaneous rectified voltage of each diode is read. This is accomplished by the electron beam being focused on the end of the antenna of the respective diode, at points indicated by the numerals in FIG. 27: 1, 2, 3 .... n, n+4, n+2 ..., m, m+1, m+2 .... At the instant the beam is focused on a given diode, the current passing through the diode junction and reaching common point A is indicative of the rectified voltage hence the intensity of the radiation then incident on the respective diode. The series of voltages produced in each of a succession of raster scans may be recorded in numerous ways, to record the succession of images; television tube 212 is here shown displaying the resultant image, the respective signals from point A controlling the blanking device for the T.V. electron gun, the gun being synchronized in its raster scan with the scan of read-out gun 210.

Figure 28:
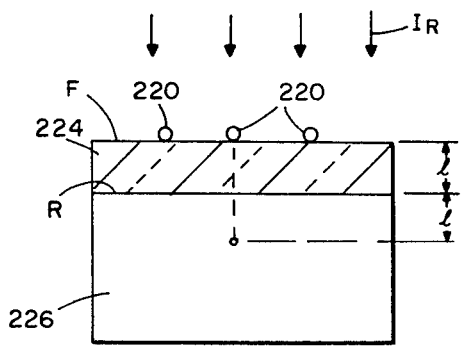
FIG. 28 is a highly magnified cross-sectional view of an array upon a substrate incorporating a spaced reflector for enhancing coupling.

Referring to the embodiment of FIG. 28, a construction is shown for improving coupling between diode array 220 and free space. The array is disposed upon surface F of a transparent layer 224 of thickness $l = \lambda/4$, $\lambda$ being the wave length of interest. On the opposite face of layer 224 is a mirror-like face for the radiation of interest. Light $I_R$ incident upon the array couples therewith and also courses through the layer 224, is reflected and reversed in phase by the reflection and courses back through layer 224 to surface F where it is also incident upon the diode. Due to the selected thickness $l$ of layer 224, the light $I_R$ has a maxima at surface F, and effective coupling is realized.

In an alternative embodiment this thickness $l$ of layer 224 may be $l = \lambda/4 + n\lambda$ where $n$ is an integer.

For fabrication of this embodiment, a block of starting material 226 is ground and polished to provide an upwardly directed surface; a substance reflective at wave length $\lambda$ is vacuum deposited in the surface, forming reflective surface 12, then a thickness $l$ of transparent material is evaporated onto surface R to form surface F, then the diodes 220 are printed upon surface F as described above.

In further alternative constructions layers of differing refractive index at the frequency of interest are employed to produce a maxima of the E field at a surface upon which are printed the light and infrared-responsive printed diodes here concerned.

Figure 29:
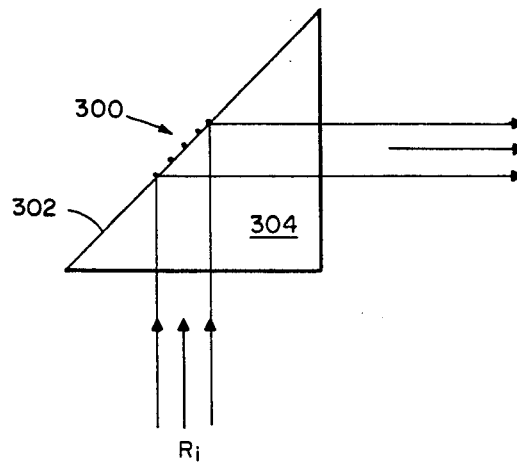
Figure 30:
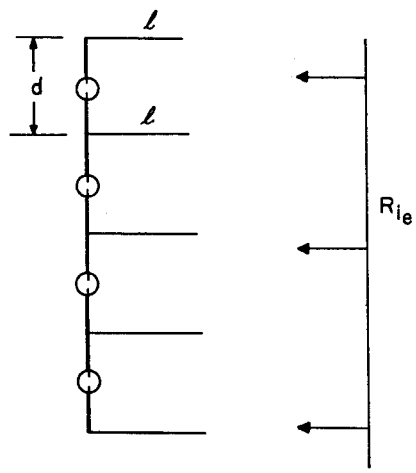
FIG. 30 is a diagram of the array employed and FIG. 31 is a perspective view of the device of FIG. 29.
Figure 31:
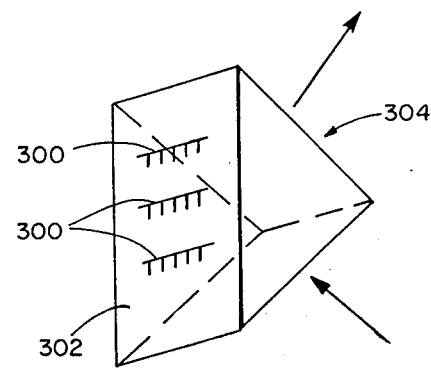

Referring to FIGS. 29–31 coupling to the devices is achieved by combination with means defining an integrated optics assembly. In the practice of integrated optics, the properties of an evanescent wave are well known. These waves can be employed to couple into the diodes. Referring to FIGS. 29 and 31 a two dimensional diode array 300 is deposited on the back side 302 of prism 304. The incident radiation $R_i$ then passes through one face of the prism, is reflected at the back side of the prism and exits at the other face. There results an evanescent surface wave propagating along the backside of the prism. By constructing the array as a fish bone antenna in accordance with FIG. 30, radiation can be coupled into the antenna array by the surface wave, $R_i$. In this embodiment $l$ can be $\lambda/4$ or $\lambda/4 + n\lambda$ where $n$ is an integer and $d$ can be less than $\lambda/2$.

As a specific example of forming the solid devices, one may begin with a dielectric substrate such as saphire, transparent to the radiation of interest. The surface is coated with a film of organic polymer such as Az 1350 resist from Shipley Co., Newton, Massachusetts, a coating which de-polymerizes upon exposure to light. The coating may be for instance from 5,000 to 20,000 A thick.

By computer suitable exposure masks are generated for the first and second metal deposits. The organic coating is exposed to light through the first mask, exposing those lines desired and the resultant depolymerized coating is washed away leaving a relief pattern for the first metal deposit. Thereupon metal is evaporated in vacuum over the entire crystal, the metal at the pattern adhering to the crystal, otherwise to the coating. The coating is then washed away as by acetone. Thereupon the dielectric layer is formed as by exposing a tungsten first metal to the atmosphere. The procedure is then repeated for the second mask, being careful to use alignment markings also generated with the first mask, for ensuring alignment of the second mask, thereby to obtain the proper amount of overlap. These or other such known techniques may be employed in forming the diodes according to this aspect of the invention.

I claim:

1. Apparatus for generating coherent optical radiation comprising at least one antenna connected to a diode junction having non-linear characteristics;

a source of electromagnetic energy coupled to said diode junction to interact with said junction to cause generation of a current through said junction, flow of said current through said antenna and emission of radiation from said antenna, said current and radiation being of optical frequency which is related to the frequency of the input and absent from the input;

an optical element for collecting said radiation of said optical frequency emitted from said antenna for direction to a station for utilization.

2. Apparatus as claimed in claim 1, said source providing a component of electromagnetic energy with a frequency in the microwave range.

3. Apparatus as claimed in claim 2, further comprising means for controllably varying said microwave frequency.

4. Apparatus as claimed in claim 3, including a control for adjusting said microwave frequency so that said emitted radiation has a desired frequency.

5. Apparatus as claimed in claim 4, said control for said microwave frequency including a feedback loop connected through said diode to stabilize the frequency of said emitted optical radiation.

6. Apparatus as claimed in claim 4 for spectroscopic analysis further including in combination a cell for containing a sample, said cell being situated to receive and pass through said sample radiation by said controlled diode; and a detector for measuring the amplitude of radiation passing through said sample in relation to the frequency thereof.

7. Apparatus as claimed in claim 5, for generating a stable frequency said feedback loop further including a cell containing material with a sharp optical absorbtion resonance arranged for passage therethrough of radiation of the frequency emitted by said diode; a detector arranged to receive radiation from said cell and operative to produce an output indicative of correspondence of the frequency of said received radiation with the resonance of said material, said output being connected to control said microwave frequency for stabilizing said radiation emitted from said diode; and an output channel connected to said diode for delivering an output signal with a frequency determined by said radiation emitted by said diode.

8. Apparatus as claimed in claim 1 for transmitting from a sending station to a receiving station a signal encoded as modulation, further comprising:

an optical carrier source for supplying carrier radiation of an optical frequency, said carrier source and said signal being coupled as input to said diode, whereby said diode mixes said optical radiation with said signal to generate and emit radiation of optical frequency modulated by said signal, and an optical element for gathering said modulated radiation emitted from said diode and directing it in a beam toward said receiving station and a receiving station comprising a demodulating diode having an antenna and a junction with non-linear characteristics, an optical element for receiving said modulated radiation from said transmitting station and concentrating it on the antenna of said demodulating diode, a source of heterodyning radiation of optical frequency, arranged for concentrating said heterodyning radiation onto the antenna of said demodulating diode, whereby said demodulating diode generates an output indicative of said signal.

* * * * *